United States Patent [19]
Ishiwata

[11] 4,449,057
[45] May 15, 1984

[54] SOLAR CELL POWER SUPPLY DEVICE

[75] Inventor: Junichi Ishiwata, Yokohama, Japan

[73] Assignee: Canon Kabushiki Kaisha, Tokyo, Japan

[21] Appl. No.: 401,250

[22] Filed: Jul. 23, 1982

[51] Int. Cl.³ .............................................. H02J 1/10
[52] U.S. Cl. ...................................... 307/43; 307/51; 307/56; 323/221; 323/906; 354/484
[58] Field of Search .................. 307/43, 44, 51, 56, 307/60; 320/2; 323/221, 229, 906; 354/31; 136/206

[56] References Cited
U.S. PATENT DOCUMENTS

| | | | |
|---|---|---|---|
| 3,896,368 | 7/1975 | Rym | 323/906 X |
| 4,079,338 | 3/1978 | Takahama et al. | 354/31 |
| 4,164,698 | 8/1979 | Kleeberg | 320/2 |
| 4,243,928 | 1/1981 | Nazimek | 323/906 X |
| 4,311,953 | 1/1982 | Fukuda et al. | 323/906 X |

Primary Examiner—William M. Shoop
Attorney, Agent, or Firm—Fitzpatrick, Cella, Harper & Scinto

[57] ABSTRACT

There is disclosed a solar cell power supply device including a first and a second solar cells. The first cell has a determined spectral sensitivity characteristic and the second cell has a different spectral sensitivity characteristic and connected parallel to the first solar cell. A voltage regulating circuit is provided for stabilizing the output voltages from the first and second solar cells and supplying thus stabilized voltage to a load.

9 Claims, 7 Drawing Figures

SOLAR CELL POWER SUPPLY DEVICE

BACKGROUND OF THE INVENTION

1. Field of the Invention

The present invention relates to an improvement in output power characteristics to various lights, of a power supply device powered by a solar cell and adapted for use in an electronic desk calculator or the like.

2. Description of the Prior Art

In a device powdered by a solar cell, for example a desk calculator, a solar cell 1 is usually connected, as shown in FIG. 1, to a processor 3 in said calculator through a voltage regulating circuit 2. The solar cell 1 is generally composed of so-called single crystal silicon solar cell elements prepared by forming PN junctions on a silicon substrate by impurity doping or amorphous solar cell elements prepared by evaporating amorphous silicon on a glass or metal substrate by glow discharge through monosilan, and such elements are serially connected in a number required for obtaining a voltage corresponding to the drive voltage of said processor 3.

The voltage regulating circuit 2 reduces the voltage $V_{IN}$ generated by the solar cell 1 to the driving voltage $V_{OUT}$ required for driving the processor 3 of the calculator and supplies a stabilized voltage to said processor. FIG. 2 shows the operational characteristic of the voltage regulating circuit 2, wherein a voltage margin for stable function of the processor 3 is defined by voltages $V_{OUT1}$ and $V_{OUT2}$. In case the voltage supplied from the solar cell 1 does not reach a value $V_{IN1}$, the corresponding output voltage does not reach the lower limit voltage $V_{OUT1}$ required for the processor 3, so that the calculator is unable to perform the normal function. FIG. 3 shows a characteristic curve A of a solar cell representing the relationship between the illuminance of illumination intensity L on the light-receiving face thereof and the generated voltage $V_{IN}$.

FIG. 3 indicates that a minimum illuminance L1 is required for obtaining a voltage exceeding $V_{IN1}$ shown in FIG. 2. Stated differently, the solar cell-powered calculator shown in FIG. 1 functions only under a light with a determined illuminance.

FIG. 4 shows the distribution of relative intensity to wavelength of the energy radiated by the sun, a white fluorescent lamp and a tungsten lamp, which are the most common light sources for the solar cell 1. The sunlight has a uniform coverage from the shorter ultraviolet wavelength region to the longer infrared wavelength region, including the visible wavelength region (450–680 nm) sensitive to the human eyes. On the other hand, the light from the white fluorescent lamp contains the components in the visible and ultraviolet wavelength region but not the components in the infrared wavelength region. Also the light from the tungsten lamp, or incandescent lamp, principally contains the components in the infrared wavelength region, and the components in the ultraviolet and visible wavelength regions are considerably less than those in the solar light or in the light from the white fluorescent lamp. Besides, the solar cells have different spectral sensitivities according to the species.

FIG. 5 shows examples of such spectral relative sensitivities, for the single-crystal silicon solar cell and the amorphous silicon solar cell, which are most popularly employed in practice. The single-crystal silicon has a high sensitivity to the light of the longer infrared wavelength region but is almost insensitive to the light of the shorter ultraviolet wavelength region. On the other hand the amorphous silicon is highly sensitive to the light of the visible and ultraviolet wavelength regions but is totally insensitive to the light of the infrared wavelength region. Consequently, as will be understood from FIGS. 4 and 5, the single-crystal silicon solar cell is capable of providing a sufficient power for driving the calculator with the light from a tungsten lamp, even under a low illuminance condition, since the spectral distribution of the light components matches the spectral sensitivity of the solar cell. However, in a situation utilizing the white fluorescent light as the light source, the generated power is reduced because of the increased component in the short wavelength region, so that the illuminance required for obtaining the voltage $V_{IN1}$ for driving the calculator increases to L2, which, as shown by the curve B in FIG. 3, is higher than L1.

On the other hand, the amorphous silicon solar cell provides sufficient power even under low illuminance light from the white fluorescent lamp since the spectral distribution of the light components matches the spectral sensitivity of the solar cell, but requires a higher illuminance L3 in FIG. 3 for obtaining the aforementioned voltage $V_{IN1}$ when powered by the tungsten lamp which provides light components mainly in the long wavelength region, thus resulting in a voltage-illuminance curve C shown in FIG. 3.

Consequently the conventional desk calculators powered by solar cells require proper selection of the light source as the illuminance required for the proper function depends significantly on the species of the light source, and, in fact, such calculators could not be used in certain locations.

SUMMARY OF THE INVENTION

The object of the present invention is to provide a solar cell power supply device capable of proper power supply without limitation on the place of use.

Another object of the present invention is to provide a solar cell power supply device having uniform spectral sensitivity to the lights of different wavelengths through the use of a combination of plural solar cells of different power-generating characteristics.

DESCRIPTION OF THE PREFERRED EMBODIMENTS

Now the present invention will be clarified in detail by description of an embodiment thereof shown in the attached drawings.

Figure 1:
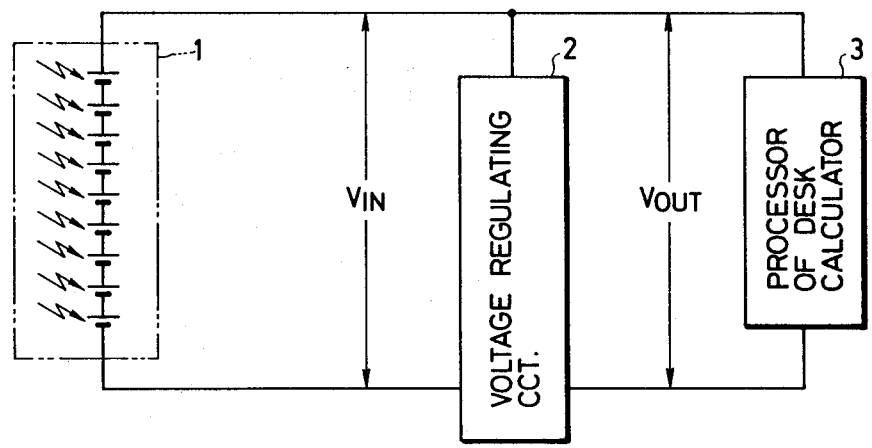
FIG. 1 is a block diagram of a conventional electronic desk calculator powered by a solar cell.
Figure 2:
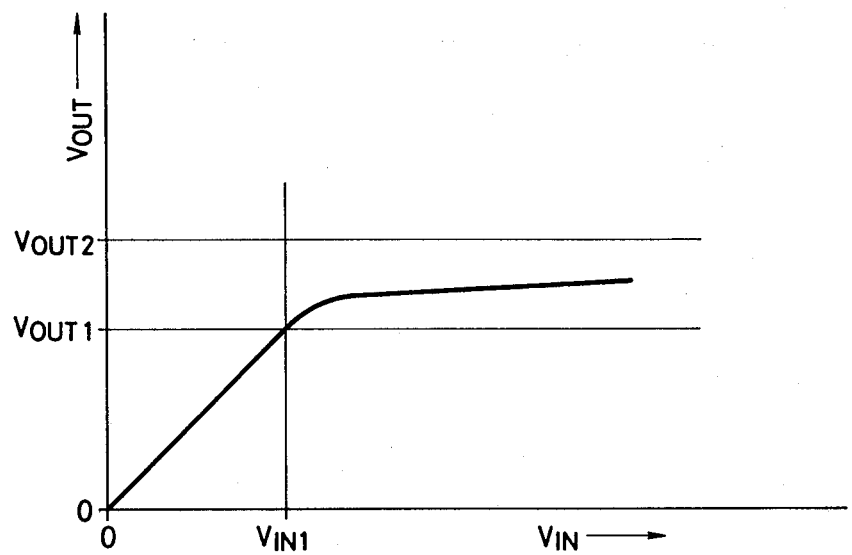
FIG. 2 is a chart showing the operational characteristic of a voltage regulating circuit.
Figure 3:
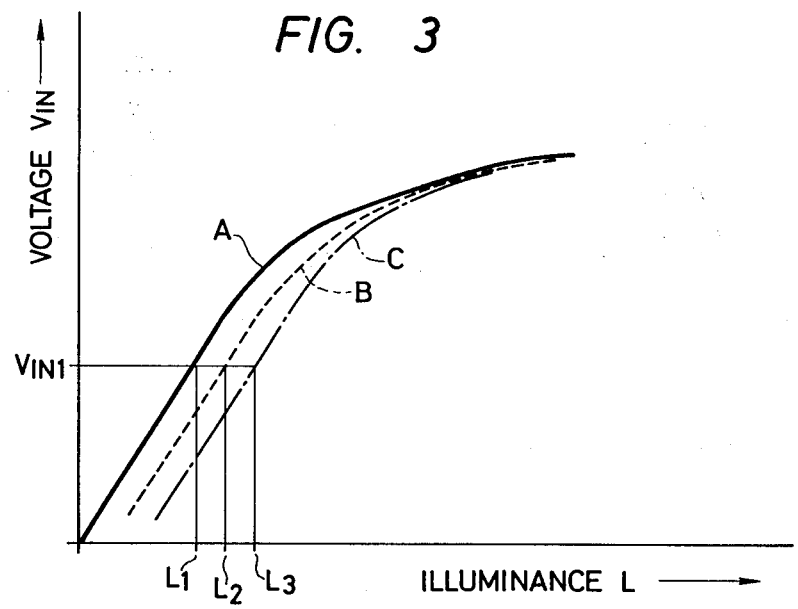
FIG. 3 is a chart showing the output voltage of solar cells in relation to illuminance for different light sources.
Figure 4:
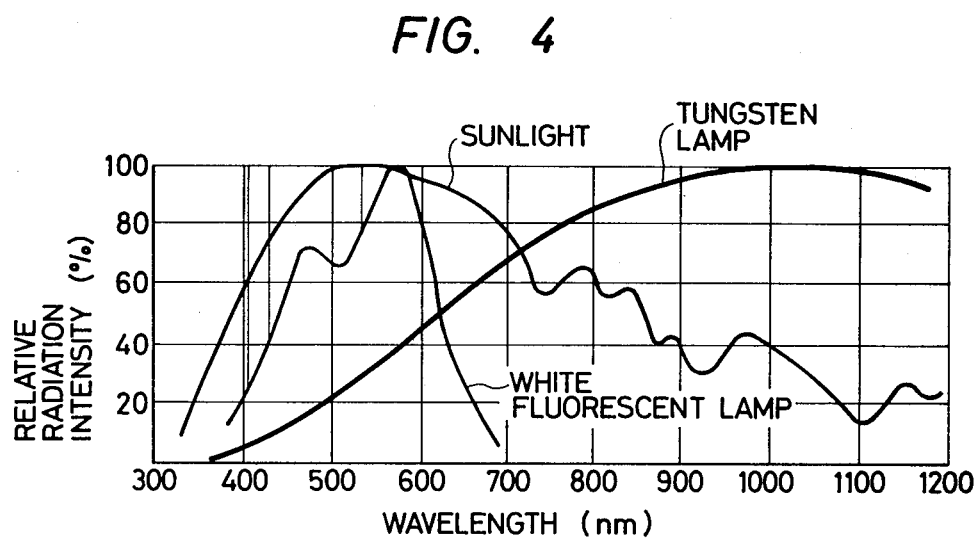
FIG. 4 is a chart showing relative radiation intensity to wavelength of various light sources.
Figure 5:
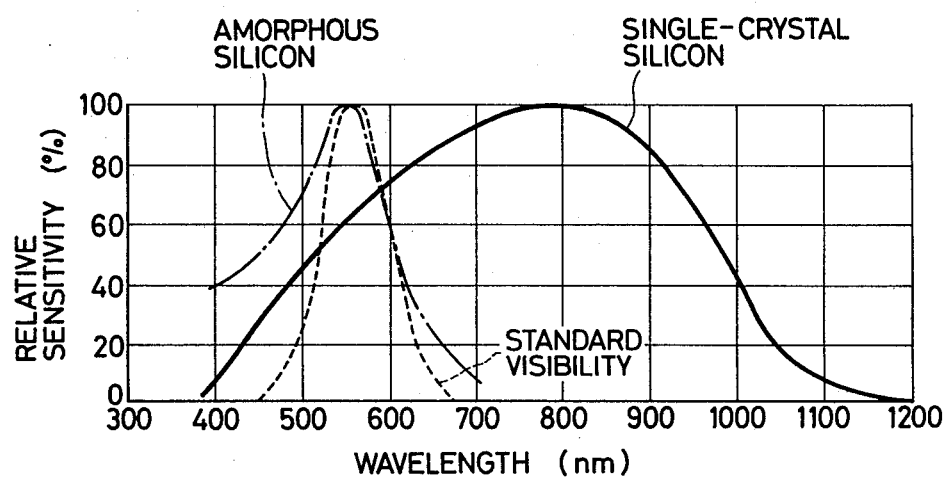
FIG. 5 is a chart showing spectral relative sensitivity of a single-crystal silicon solar cell and an amorphous silicon solar cell.
Figure 6:
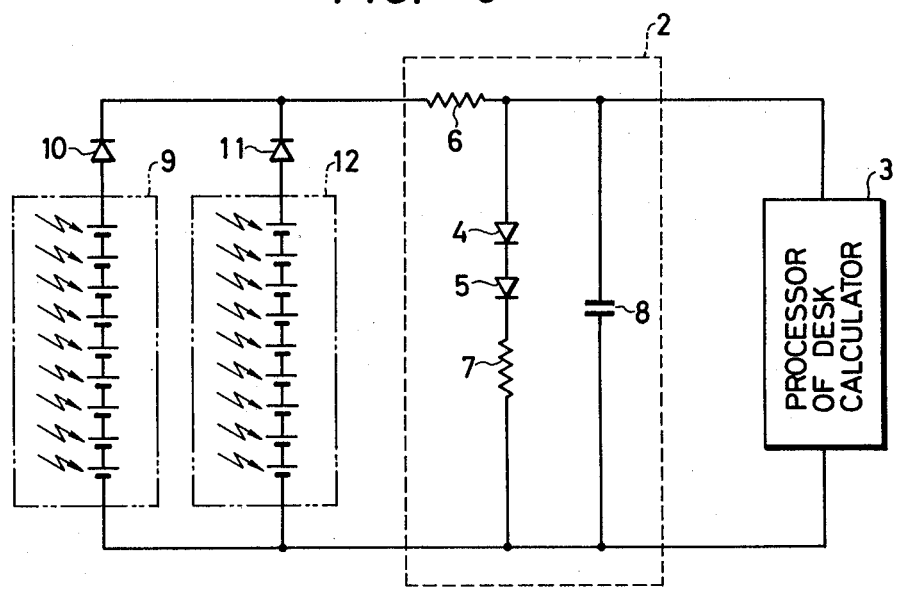
FIG. 6 is a block diagram showing an embodiment of a desk calculator powered by a solar cell power supply device of the present invention.
Figure 7:
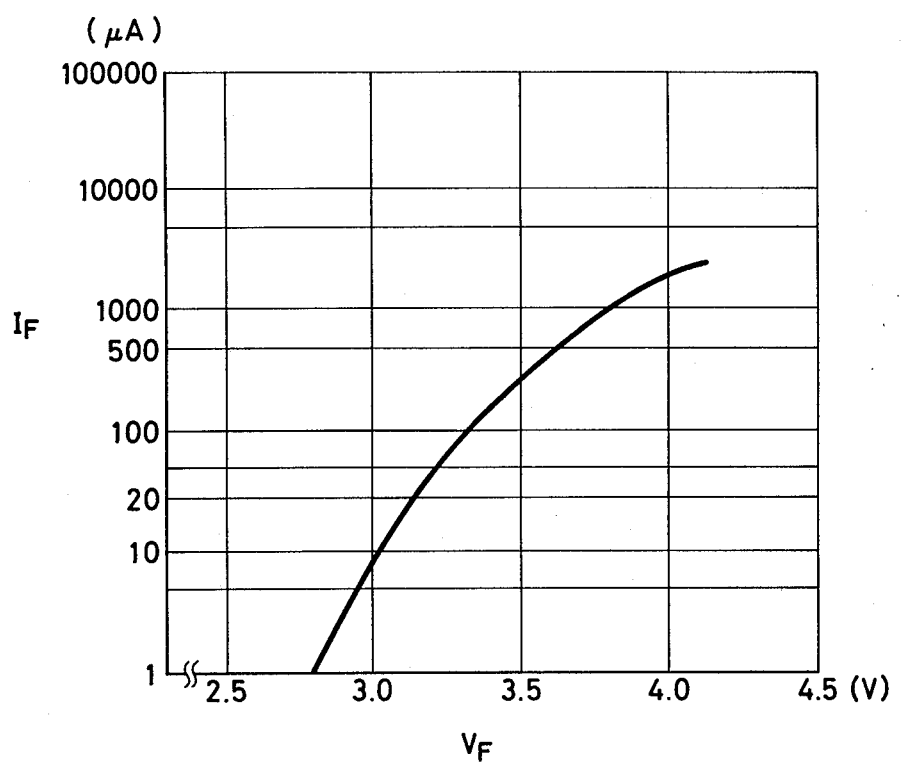
FIG. 7 is a chart showing the relationship between the forward current $I_F$ and the forward voltage drop $V_F$ of a light-emitting diode (LED).

FIG. 6 shows an embodiment of the present invention, wherein a solar cell 9, for example a single crystal silicon solar cell and another solar cell 12, for example an amorphous silicon solar cell respectively have mixture sensitivities at different wavelengths as shown in FIG. 5. Said solar cells 9, 12 are respectively connected to diodes 10, 11. The cathodes of said solar cells 9, 12 are commonly connected, and the cathodes of said diodes 10, 11 are also commonly connected. The output voltage from the power supply composed of said solar cells 9, 12 and said diodes 10, 11 is supplied to the load, such as the processor of the desk calculator, through the voltage regulating circuit 2, which, as shown in FIG. 6, is composed of resistors 6, 7, voltage stabilizing diodes 4, 5 and a smoothing condenser 8. Said voltage stabilizing diodes are composed of light-emitting diodes (LED) which easily provide a low reference voltage. A forward current is supplied through the resistors 6, 7 to said light-emitting diodes 4, 5 which show a relation between the forward current $I_F$ and the forward voltage drop $V_F$ as shown in FIG. 7. Consequently the input and output voltages of the voltage regulating circuit 2, composed of said resistors 6, 7, voltage stabilizing diodes 4, 5 and smoothing condenser 8 vary according to the illuminance.

The function of the solar cell power supply device of the present invention is as follows.

In response to a light containing a higher proportion in the infrared region, such as from a tungsten lamp, the amorphous silicon solar cell 12 having a higher sensitivity in the shorter wavelength region generates a low output voltage, while the single-crystal silicon solar cell 9 having a higher sensitivity in the longer wavelength region generates a high output voltage. Since the anodes of said solar cells 9, 12 are connected through the diodes 10, 11, the higher of the output voltage of said solar cells is supplied to the output terminal of the power supply device. Consequently, under illumination by a tungsten lamp, the output voltage of the single-crystal silicon solar cell 9 is supplied to the voltage regulating circuit 2. In such situation, the diode 11 prevents the output current of the single-crystal silicon solar cell 9 from flowing into the amorphous silicon solar cell 12. Under illumination by a light rich in the shorter and visible wavelength components such as from the white fluorescent lamp, the output voltage of the amorphous silicon solar cell 12 becomes higher than that of the single-crystal silicon solar cell 9, so that the voltage regulating circuit 2 receives the output voltage of said amorphous silicon solar cell 12. In such situation, the diode 10 prevents the output current of the amorphous silicon solar cell 12 from flowing into the single-crystal silicon solar cell 9. Also under illumination by a composite light source made for example of a tungsten lamp and a white fluorescent lamp or a mercury lamp, or under illumination by natural solar light, the load is shared by both solar cells.

The present invention provides a power supply device having a uniform spectral sensitivity to the lights of various wavelengths, since the output voltage of solar cells of different spectral sensitivity characteristics are mutually combined. Consequently the load, such as the desk calculator, can be operated satisfactorily regardless of the nature of the light source, as long as the illuminance exceeds a determined level.

Although the solar cell in the foregoing embodiment is composed of a parallel connection of a single-crystal silicon solar cell and an amorphous silicon solar cell, it is also possible to combine three or more different solar cells according to the nature of the available light sources. It is furthermore possible to reduce the influence of the nature of the light sources by serially connecting different solar cells.

What I claim is:

1. A solar cell power supply device comprising:
   a first solar cell having a determined spectral sensitivity characteristic;
   a second solar cell having a different spectral sensitivity characteristic and connected in parallel to said first solar cell; and
   a voltage regulating circuit for stabilizing the output voltages from said first and second solar cells and supplying thus stabilized voltage to a load.

2. A solar cell power supply device according to claim 1, wherein said first solar cell includes a serial connection of solar cell elements.

3. A solar cell power supply device according to claim 2, wherein said solar cell elements are single-crystal silicon solar cell elements.

4. A solar cell power supply device according to claim 1, wherein said second solar cell includes a serial connection of solar cell elements.

5. A solar cell power supply device according to claim 4, wherein said solar cell elements are amorphous silicon solar cell elements.

6. A solar cell power supply device comprising:
   first reverse current stopping means;
   a first solar cell having a first spectral sensitivity characteristic and connected serially to said first reverse current stopping means;
   second reverse current stopping means;
   a second solar cell having a second spectral sensitivity characteristic and connected serially to said second reverse current stopping means; and
   a voltage regulating circuit connected to said first and second solar cells for stabilizing the output voltages of said solar cells through said first and second reverse current stopping means and supplying thus stabilized voltage to a load.

7. A solar cell power supply device according to claim 6, wherein first and second reverse current stopping means include diodes.

8. A solar cell power supply device according to claim 7, wherein said solar cells having first and second spectral sensitivity characteristics include an amorphous silicon solar cell and a single-crystal silicon solar cell.

9. A solar cell power supply device comprising:
   a first solar cell having a first spectral sensitivity characteristic; and
   a second solar cell having a second spectral sensitivity characteristic different from said first spectral sensitivity characteristic.

* * * * *

UNITED STATES PATENT AND TRADEMARK OFFICE
CERTIFICATE OF CORRECTION

PATENT NO. : 4,449,057
DATED : May 15, 1984
INVENTOR(S) : JUNICHI ISHIWATA

It is certified that error appears in the above-identified patent and that said Letters Patent is hereby corrected as shown below:

IN THE HEADNOTE

Between [22] and [51] insert

--[30]  Foreign Application Priority Data

Aug. 6, 1981 [JP]  Japan ...........56-123511--.

IN THE ABSTRACT

Line 1, "diclosed" should be --disclosed--.

Column 1, line 37, change "of" to --or--.
Column 3, lines 10-11, change "mixture" to --maximum--.

Signed and Sealed this

Twenty-eighth Day of August 1984

[SEAL]

Attest:

GERALD J. MOSSINGHOFF

Attesting Officer

Commissioner of Patents and Trademarks